US009166613B2

(12) United States Patent
Tanaka (10) Patent No.: US 9,166,613 B2
(45) Date of Patent: Oct. 20, 2015

(54) A/D CONVERSION CIRCUIT AND SOLID-STATE IMAGING DEVICE (71) Applicant: OLYMPUS CORPORATION, Tokyo (JP)

(72) Inventor: Takanori Tanaka, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 263 days.

(21) Appl. No.: 13/887,939

(22) Filed: May 6, 2013

(65) Prior Publication Data
US 2013/0299676 A1   Nov. 14, 2013

(30) Foreign Application Priority Data
May 10, 2012  (JP) ................................ 2012-108365

(51) Int. Cl.
H03M 1/56 (2006.01)
H03M 1/34 (2006.01)
H04N 5/335 (2011.01)
H04N 5/378 (2011.01)
H03M 1/12 (2006.01)

(52) U.S. Cl.
CPC *H03M 1/34* (2013.01); *H03M 1/56* (2013.01); *H04N 5/3355* (2013.01); *H04N 5/378* (2013.01); *H03M 1/123* (2013.01)

(58) Field of Classification Search
CPC ......... H03M 1/14; H03M 1/50; H03M 1/502; H03M 1/56; H04N 5/374–5/37455
See application file for complete search history.

(56) References Cited

U.S. PATENT DOCUMENTS

| | | | |
|---|---|---|---|
| 5,703,499 A * | 12/1997 | Abe et al. | 326/62 |
| 6,501,315 B1 * | 12/2002 | Nguyen | 327/217 |
| 2010/0271519 A1 * | 10/2010 | Ui et al. | 348/302 |
| 2011/0292265 A1 * | 12/2011 | Takahashi et al. | 348/308 |
| 2013/0146751 A1 * | 6/2013 | Hagihara | 250/208.1 |

FOREIGN PATENT DOCUMENTS

| | | |
|---|---|---|
| JP | 05-014138 A | 1/1993 |
| JP | 2008-259228 A | 10/2008 |
| JP | 2009-038726 A | 2/2009 |
| JP | 2009-038781 A | 2/2009 |
| JP | 2010-050529 A | 3/2010 |
| JP | 2012-039386 A | 2/2012 |

OTHER PUBLICATIONS

Machine translation of JP 2012-039386 A by JPO/INPIT.*
Notice of Reason for Rejection dated Dec. 16, 2014, issued in corresponding Japanese Application No. 2012-108365, w/English translation. (4 pages).

*Primary Examiner* — Howard Williams
(74) *Attorney, Agent, or Firm* — Westerman, Hattori, Daniels & Adrian, LLP (57) ABSTRACT An A/D conversion circuit and a solid-state imaging device are able to reduce current consumption, and two input terminals of a NAND element included in a latch circuit receive a corresponding one of a plurality of clock signals and an enable signal. The enable signal is not input to the NAND element before an end timing of A/D conversion, and is input to the NAND element at the end timing of the A/D conversion and at a timing at which latching is performed. The latch circuit latches no clock signal when the enable signal is not input.

6 Claims, 10 Drawing Sheets

A/D CONVERSION CIRCUIT AND SOLID-STATE IMAGING DEVICE

BACKGROUND OF THE INVENTION

1. Field of the Invention

The present invention relates to an A/D conversion circuit and a solid-state imaging device using the same.

The application is based on and claims the benefit of priority from prior Japanese Patent Application No. 2012-108365, filed May 10, 2012, the entire contents of which are incorporated herein.

2. Description of Related Art

Figure 9:
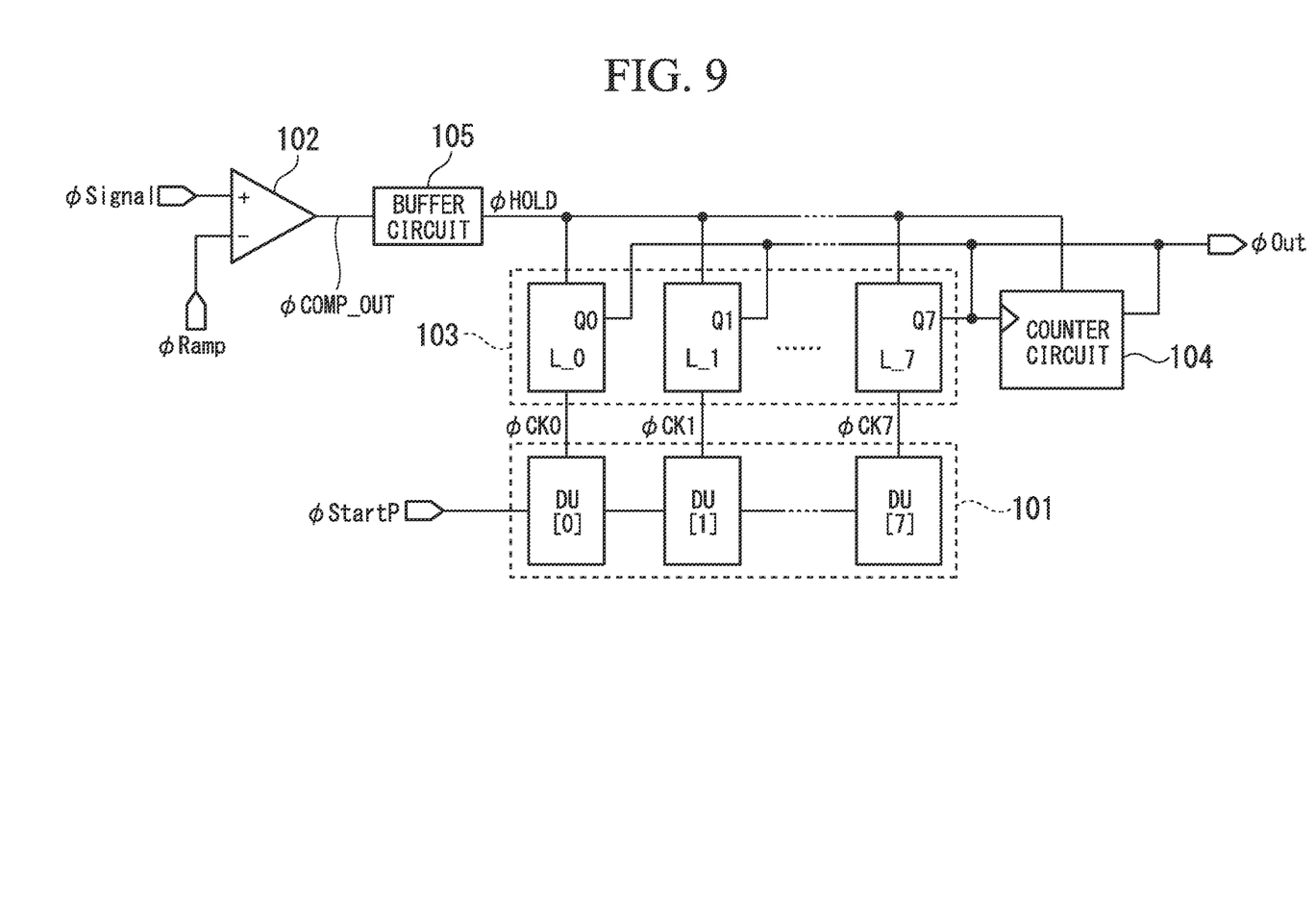
FIG. 9 is a block diagram illustrating the configuration of an A/D conversion circuit according to the related art.

As an example of an A/D conversion circuit used in a solid-state imaging device of the related art, a configuration illustrated in FIG. 9 has been known (for example, see Japanese Unexamined Patent Application, First Publication No. 2009-38726, and Japanese Unexamined Patent Application, First Publication No. 2009-38781). Firstly, the configuration of the A/D conversion circuit illustrated in FIG. 9 will be described. The A/D conversion circuit illustrated in FIG. 9 includes a phase shift portion 101, a comparison circuit 102, a latch portion 103, a counter circuit 104, and a buffer circuit 105.

The phase shift portion 101 includes a plurality of delay units DU[0] to DU[7] that delay and output an input signal. A start pulse φStartP is input to the first delay unit DU[0]. The comparison circuit 102 receives an analog signal φSignal, which is an object of time detection, and a ramp wave φRamp that decreases with the lapse of time, and outputs a signal φCOMP_OUT indicating a result obtained by comparing the analog signal φSignal with the ramp wave φRamp. The latch portion 103 includes latch circuits L_0 to L_7 that latch logical states of output signals φCK0 to φCK7 of each of the delay units DU[0] to DU[7] of the phase shift portion 101. The counter circuit 104 performs counting based on the output signal φCK7 of the delay unit DU[7] of the phase shift portion 101.

The comparison circuit 102 generates a time interval (the size in a time axial direction) according to the amplitude of the analog signal φSignal. The buffer circuit 105 is an inversion buffer circuit that inverts and outputs an input signal. Hereinafter, in order to facilitate the understanding of the description of the present specification, the buffer circuit 105 has a configuration of the inversion buffer circuit.

The latch circuits L_0 to L_7 constituting the latch portion 103 are in an enable (valid) state when an output signal φHOLD of the buffer circuit 105 is High, and output the output signals φCK0 to φCK7 of the delay units DU[0] to DU[7] as is. Furthermore, the latch circuits L_0 to L_7 are in a disable (invalid) state when the output signal φHOLD of the buffer circuit 105 is transitioned from High to Low, and latch logic states according to the output signals φCK0 to φCK7 of the delay units DU[0] to DU[7] at that time.

A count latch circuit, which latches a logic state of a count result of the counter circuit 104, is not illustrated. However, the counter circuit having a latch function is used, so that the counter circuit 104 serves as the count latch circuit.

Figure 10:
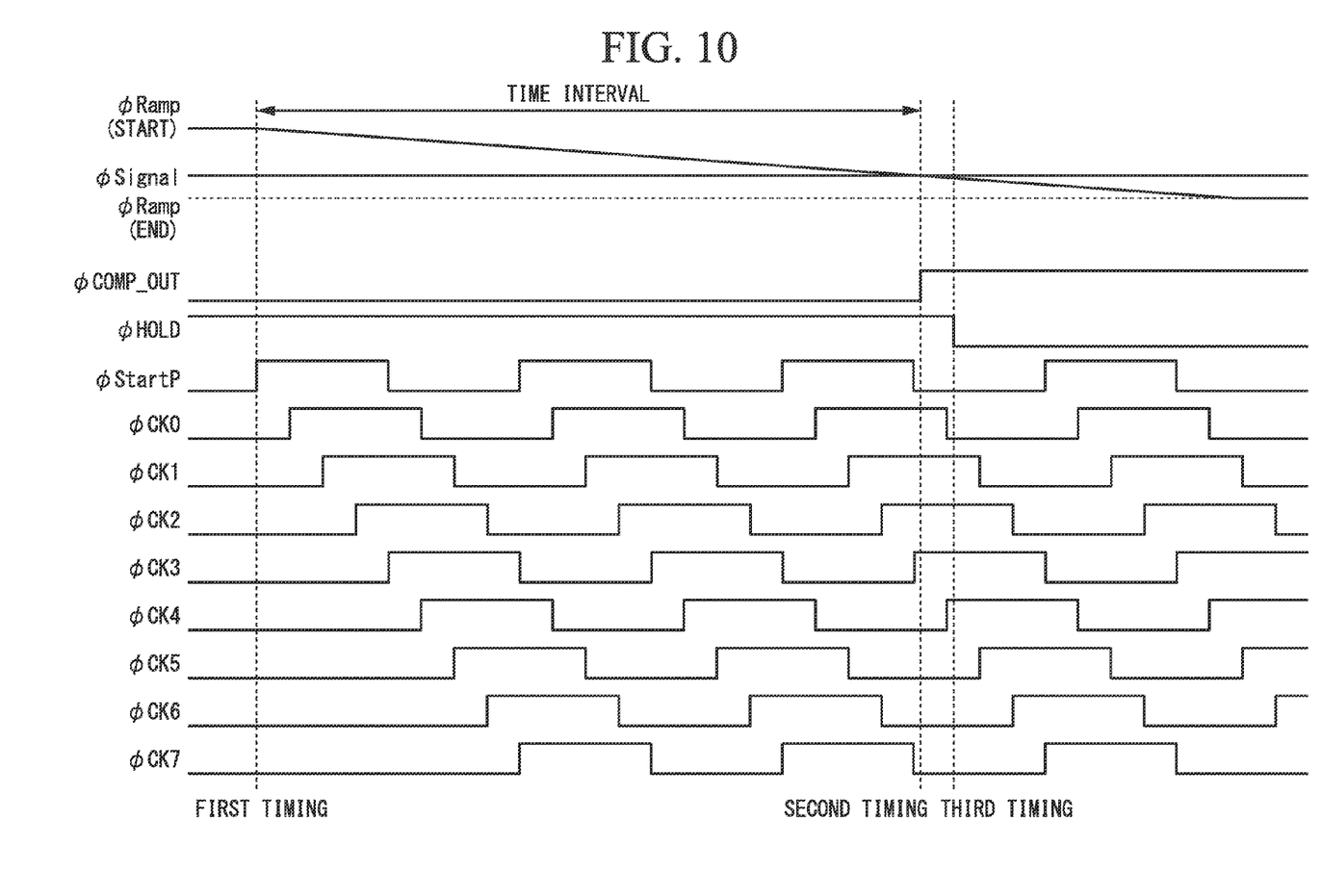
FIG. 10 is a timing chart illustrating the operation of an A/D conversion circuit according to the related art.

Next, an operation of the related art will be described. FIG. 10 illustrates the operation of an A/D conversion circuit according to the related art. Firstly, at a timing (a first timing) related to the comparison start of the comparison circuit 102, as the start pulse φStartP, a clock of a cycle, which approximately coincides with the delay time (the sum of delay times of the eight delay units DU[0] to DU[7]) of the phase shift portion 101, is input to the phase shift portion 101.

In this way, the phase shift portion 101 starts to operate. The delay unit DU[0] constituting the phase shift portion 101 delays the start pulse φStartP and outputs the output signal φCK0. The delay units DU[1] to DU[7] constituting the phase shift portion 101 delay output signals of delay units of a previous stage and output the output signals φCK1 to φCK7, respectively. The output signals φCK0 to φCK7 of the delay units DU[0] to DU[7] are input to the latch circuits L_0 to L_7 of the latch portion 103. The latch circuit L_7 outputs the output signal φCK7 of the input delay unit DU[7] to the counter circuit 104 as is.

The counter circuit 104 performs a counting operation based on the output signal φCK7 of the delay unit DU[7], which is output from the latch circuit L_7 of the latch portion 103. In the counting operation, a count value is increased or decreased at the rise or the fall of the output signal φCK7. At a timing (a second timing) at which the analog signal φSignal approximately coincides with the ramp wave φRamp, the output signal φCOMP_OUT of the comparison circuit 102 is inverted. Moreover, at a timing (a third timing) after the lapse of a predetermined delay time applied to the input signal in the buffer circuit 105, the output signal φHOLD of the buffer circuit 105 becomes a Low state.

In this way, the latch circuits L_0 to L_7 become a disable state. At this time, logic states according to the output signals φCK0 to φCK7 of the delay units DU[0] to DU[7] are latched in the latch circuits L_0 to L_7. The counter circuit 104 latches a count value when the latch circuit L_7 stops operating. By the logic state latched in the latch portion 103 and the count value latched in the counter circuit 104, digital data corresponding to the analog signal φSignal is obtained.

In accordance with the A/D conversion circuit according to the related art, it is possible to obtain digital data corresponding to the time interval according to the voltage of the analog signal φSignal. That is, it is possible to obtain the digital data corresponding to the analog signal φSignal.

SUMMARY OF THE INVENTION

According to a first aspect the present invention, an A/D conversion circuit includes: a reference signal generation portion that generates a reference signal that increases or decreases with lapse of time from a predetermined start timing; a comparison portion that compares an analog signal with the reference signal, and outputs a comparison signal at an end timing at which the reference signal satisfies a predetermined condition with respect to the analog signal; a phase shift portion that outputs a plurality of clock signals having different phases from one another in response to a time change from the start timing; a latch portion including a plurality of latch units, each of the plurality of latch units latching a corresponding one of the plurality of clock signals after a predetermined time lapses from an end timing based on the comparison signal; and an operation portion that generates a digital signal according to a signal held in the latch portion. Each of the plurality of latch units includes a logic element having a first input terminal and a second input terminal. The first input terminal receives the corresponding one of the plurality of clock signals, and the second input terminal does not receive an enable signal before the end timing based on the comparison signal and receives the enable signal at the end timing based on the comparison signal and at a timing at which the latch portion performs latching. Each of the plurality of latch units does not latch the corresponding one of the plurality of clock signals when the enable signal is not received.

According to a second aspect of the present invention, in the A/D conversion circuit according to the first aspect, each of the plurality of latch units that is connected to the logic element and further includes a delay element that delays a signal output from the logic element. After the predetermined time lapses from the end timing based on the comparison signal, a signal output from the delay element is looped and input to the delay element, so that a latch operation is performed.

Furthermore, according to a third aspect of the present invention, in the A/D conversion circuit according to the first aspect, each of the plurality of latch units that is connected to the logic element and further includes a delay element that delays a signal output from the logic element. After the predetermined time lapses from the end timing based on the comparison signal, a signal output from the delay element is looped and input to the first input terminal of the logic element, so that a latch operation is performed.

Furthermore, according to a fourth aspect of the present invention, in the A/D conversion circuit according to any one of the first to third aspects, the phase shift portion includes a plurality of delay units that delay and output an input signal and is a ring-like delay circuit in which the plurality of delay units are connected to one another in a ring shape.

According to a fifth aspect of the present invention, a solid-state imaging device includes: an imaging portion in which a plurality of pixels are arranged in a matrix form to output a pixel signal in response to aa amplitude of an incident electromagnetic wave; and the A/D conversion circuit that receives the analog signal according to the pixel signal. The comparison portion and the latch portion are provided for one column or a plurality of columns of the pixels constituting the imaging portion.

DETAILED DESCRIPTION OF THE INVENTION

Hereinafter, with reference to the accompanying drawings, embodiments of the present invention will be described.

First Embodiment

Figure 1:
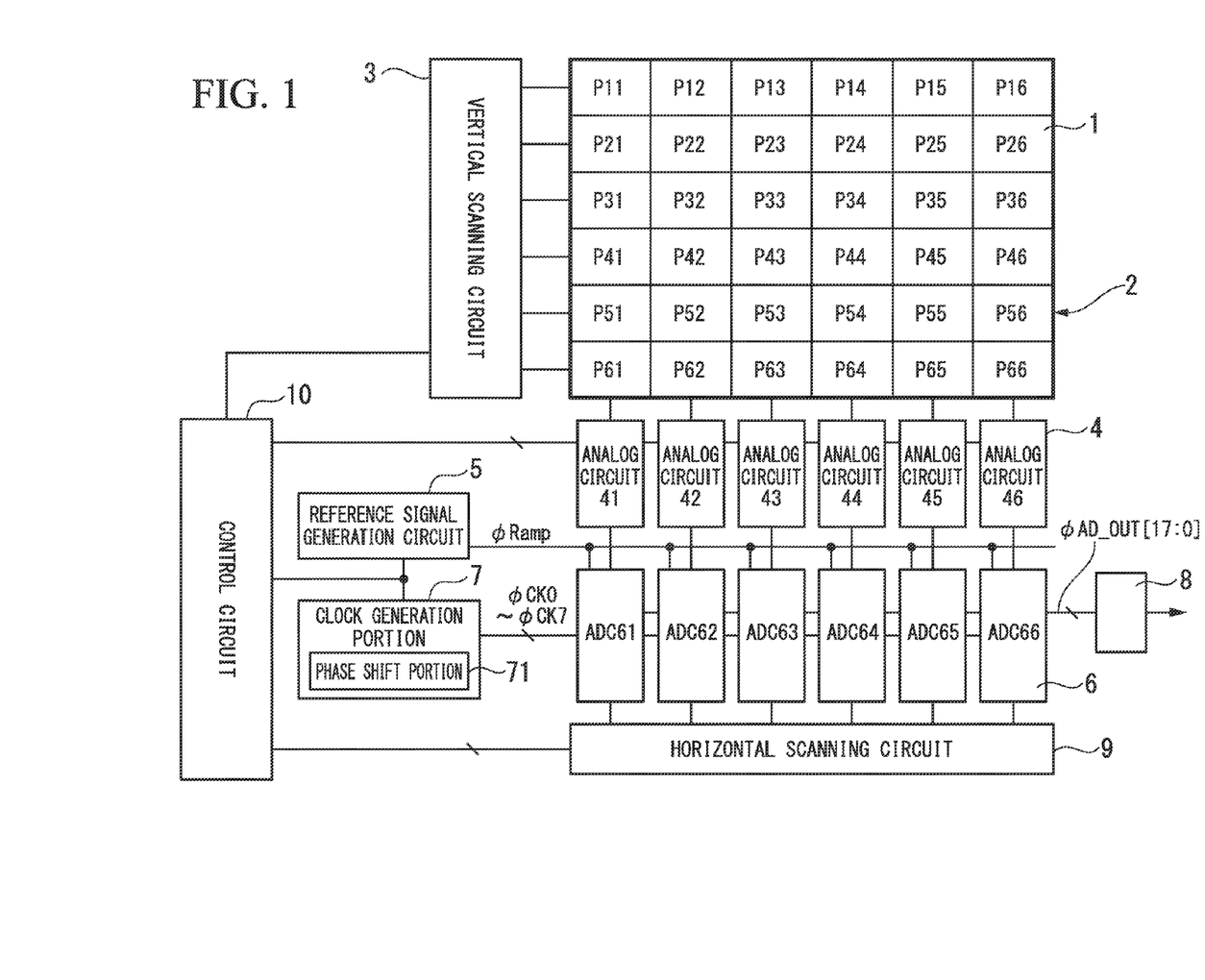
FIG. 1 is a block diagram illustrating the configuration of a solid-state imaging device according to a first embodiment of the present invention.

Firstly, a first embodiment of the present invention will be described. FIG. 1 illustrates the configuration of a solid-state imaging device according to the present embodiment. The solid-state imaging device illustrated in FIG. 1 includes a pixel array 2 (an imaging portion) having a unit pixel 1, a vertical scanning circuit 3, analog circuits 4 (an analog circuit 41, an analog circuit 42, an analog circuit 43, an analog circuit 44, an analog circuit 45, and an analog circuit 46), a reference signal generation circuit 5 (a reference signal generation portion), A/D conversion circuits 6 (an ADC 61, an ADC 62, an ADC 63, an ADC 64, an ADC 65, and an ADC 66), a clock generation portion 7, an encoder circuit 8 (an operation portion), a horizontal scanning circuit 9, and a control circuit 10.

The unit pixel 1 constituting the pixel array 2 has at least a photoelectric conversion element, and outputs a pixel signal according to the amplitude of an incident electromagnetic wave. The pixel array 2 includes the unit pixel 1 arranged in a two-dimensional manner (6 rows×6 columns in the example illustrated in FIG. 1). The vertical scanning circuit 3 includes a shift register or a decoder, and performs row selection of the pixel array 2. The analog circuit 4 includes a so-called CDS circuit and the like, and processes and outputs a pixel signal read from the pixel array 2. The reference signal generation circuit 5 generates a reference signal (a ramp wave) that increases or decreases with the lapse of time.

The clock generation portion 7 includes a phase shift portion 71. The A/D conversion circuits 6 convert an analog pixel signal, which is read from the unit pixel 1 through the analog circuit 4, into digital data, and output the converted digital data as an output signal φAD_OUT. The encoder circuit 8 outputs a digital signal obtained by binarizing the output signal φAD_OUT of the A/D conversion circuit 6. The horizontal scanning circuit 9 includes a shift register or a decoder, and controls the A/D conversion circuits 6 to output the digital data, which is held in the A/D conversion circuits 6, for each column. The control circuit 10 outputs various control signals to the circuits constituting the solid-state imaging device.

Figure 2A:
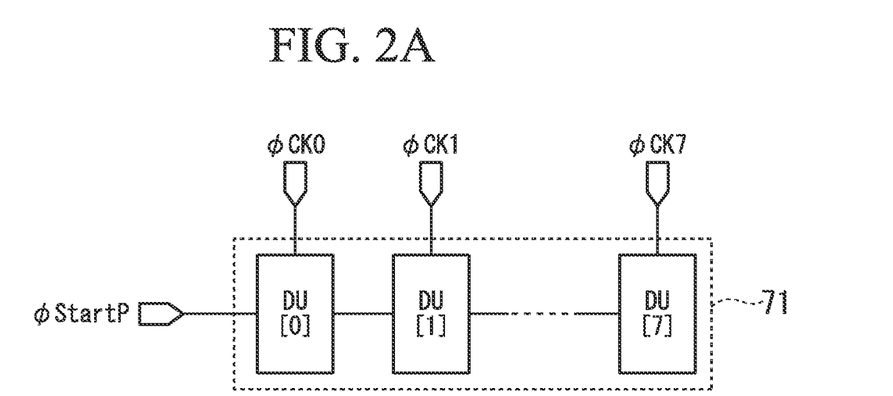
FIG. 2A is a block diagram illustrating the configuration of a phase shift portion included in a solid-state imaging device according to a first embodiment of the present invention.

FIG. 2A illustrates the configuration of the phase shift portion 71. The phase shift portion 71 includes a plurality of delay units DU[0] to DU[7] that delay and output an input signal. The delay units DU[0] to DU[7] are serially connected to one another in sequence of the delay unit DU[0], the delay unit DU[1], the delay unit DU[2], . . . , the delay unit DU[7], wherein a start pulse φStartP is input to the first delay unit DU[0]. The delay unit DU[0] delays and outputs the input start pulse φStartP, and the delay units DU[1] to DU[7] delay output signals of delay units of a previous stage and output the delayed output signals as output signals φCK0 to φCK7 (clock signals), respectively.

Figure 2B:
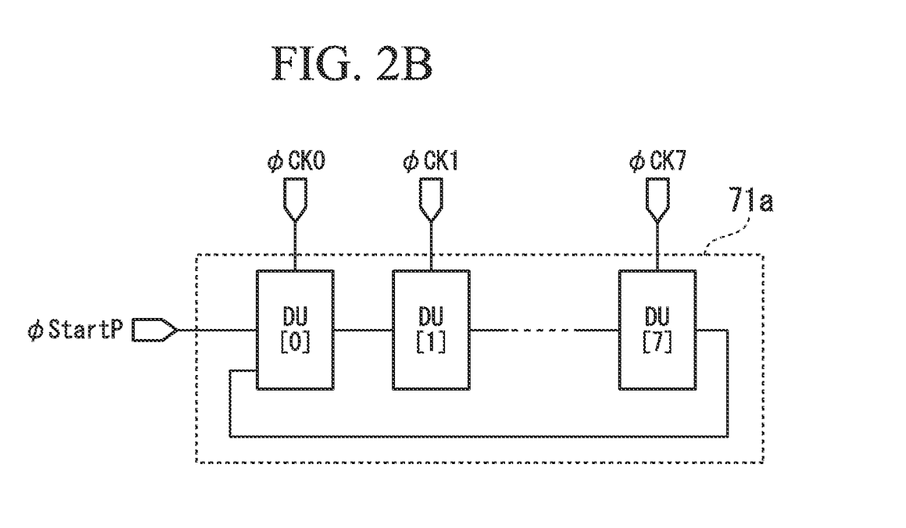
FIG. 2B is a block diagram illustrating the configuration of a phase shift portion (a ring-like delay circuit) included in a solid-state imaging device according to a first embodiment of the present invention.

As the phase shift portion 71, instead of the configuration illustrated in FIG. 2A, it may be possible to use a ring-like delay circuit (a phase shift portion 71a) in which a plurality of delay units DU[0] to DU[7] are connected to one another in a ring shape. FIG. 2B illustrates the configuration of the phase shift portion 71a. In the phase shift portion 71a, an output signal of the delay unit DU[7] is input to the delay unit DU[0]. The phase shift portion 71a starts to operate when a logic state of the start pulse φStartP is changed from a Low state to a High state.

Figure 3:
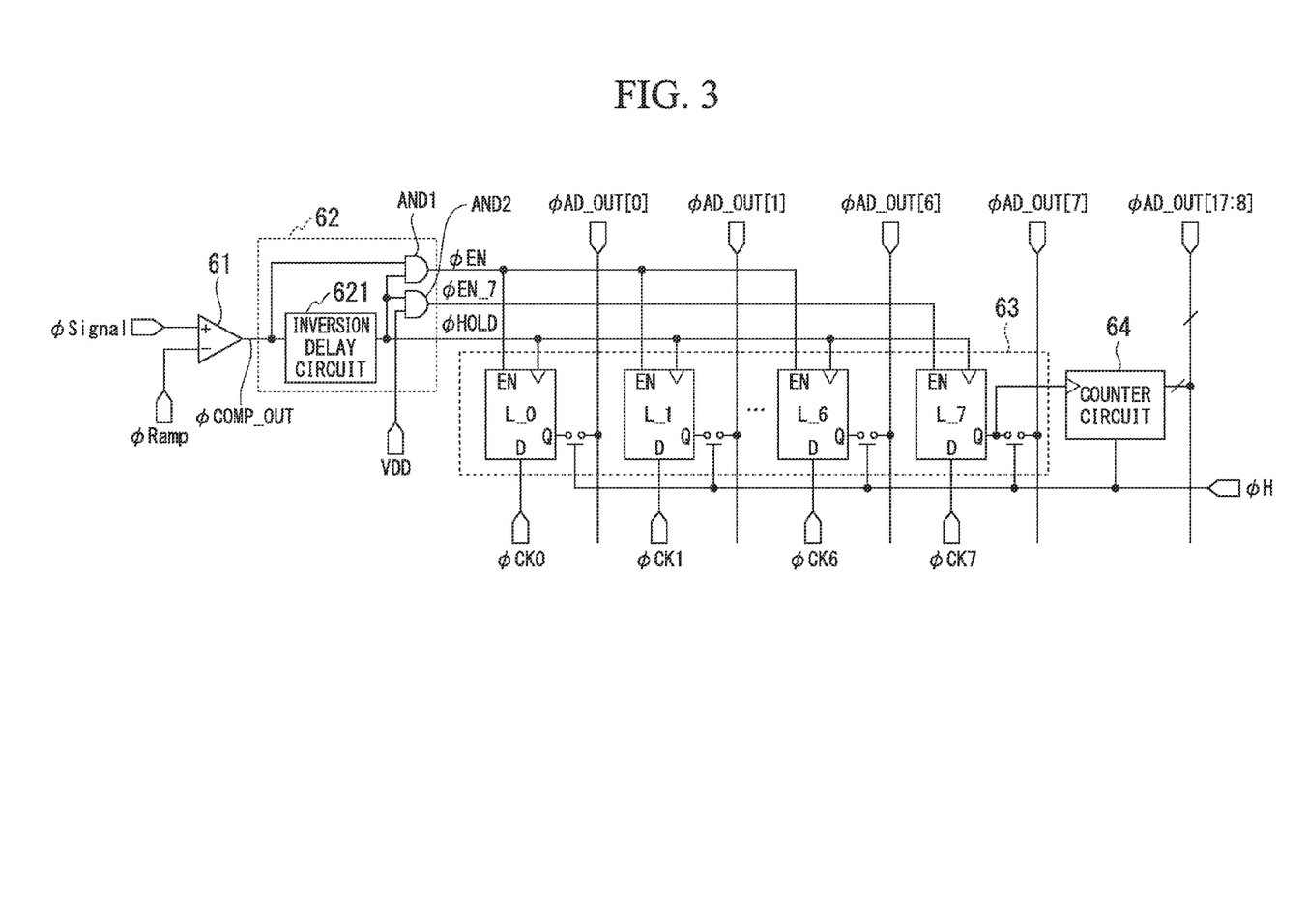
FIG. 3 is a block diagram illustrating the configuration of an A/D conversion circuit included in a solid-state imaging device according to a first embodiment of the present invention.

Next, the configuration of the A/D conversion circuit 6 will be described. The A/D conversion circuit 6 is provided for each pixel row, and in FIG. 1, the six A/D conversion circuits 6 (the ADC 61, the ADC 62, the ADC 63, the ADC 64, the ADC 65, and the ADC 66) are provided. The A/D conversion circuit 6 of each column has the same configuration. FIG. 3 illustrates the configuration of the A/D conversion circuits 6. The A/D conversion circuits 6 include a comparison circuit 61 (a comparison portion), a latch control portion 62, a latch portion 63, and a counter circuit 64.

The comparison circuit 61 compares a signal voltage according to an analog pixel signal φSignal output from the unit pixel 1 through the analog circuit 4 with a signal voltage according to a ramp wave φRamp supplied from the reference signal generation circuit 5, and converts the amplitude of the pixel signal φSignal into a time interval (a pulse width) indicating information in the time width direction. An output signal φCOMP_OUT (a comparison signal), which is a comparison output of the comparison circuit 61, for example, is at a Low level when the signal voltage according to the ramp wave φRamp is larger than the signal voltage according to the pixel signal φSignal, and is at a High level when the signal voltage according to the ramp wave φRamp is equal to or less than the signal voltage according to the pixel signal φSignal.

The latch control portion 62 includes an inversion delay circuit 621 and AND elements AND1 and AND2, and generates control signals (φEN, φEN_7, and φHOLD) for controlling the latch portion 63 based on the output signal φCOMP_OUT of the comparison circuit 61. In order to facilitate a description, delay times of the AND elements AND1 and AND2 are assumed to be equal to each other.

One input terminal of the AND element AND1 is connected to an output terminal of the comparison circuit 61, the other input terminal of the AND element AND1 is connected to an output terminal of the inversion delay circuit 621, and the AND element AND1 outputs a result obtained by performing an AND operation on signals input to the two input terminals. One input terminal of the AND element AND2 is connected to the output terminal of the inversion delay circuit 621, the other input terminal of the AND element AND2 is connected to a power supply voltage VDD, and the AND element AND2 functions as a buffer circuit that buffers and outputs a signal input to the one input terminal.

The output signal φCOMP_OUT of the comparison circuit 61 is output to the inversion delay circuit 621 and the AND element AND1. The inversion delay circuit 621 inverts and delays the output signal φCOMP_OUT of the comparison circuit 61. An output signal of the inversion delay circuit 621 is output to the AND element AND1, and is also output to the latch portion 63 as an output signal φHOLD. The AND element AND1 outputs a signal, which is obtained by performing an AND operation on the output signal φCOMP_OUT of the comparison circuit 61 and the output signal of the inversion delay circuit 621, to the latch portion 63 as an enable signal φEN. The AND element AND2 buffers the output signal φCOMP_OUT of the comparison circuit 61 and outputs the buffered signal to the latch portion 63 as an enable signal φEN7.

The latch portion 63 includes latch circuits L_0 to L_7 (latch units). The latch circuits L_0 to L_7 latch (hold/store) logic states of signals, which are input to input terminals D thereof, at a timing at which the output signal φHOLD of the latch control portion 62 is inverted.

The counter circuit 64 performs counting based on a signal output from an output terminal Q of the latch circuit L_7 of the latch portion 63. The counter circuit 64 is considered to be a counter circuit having a latch function of holding the logic state of the counter circuit 64. A lower data signal indicated by the logic state of the latch portion 63, for example, is 8-bit data. Furthermore, an upper data signal indicated by the count result of the counter circuit 64, for example, is 10-bit data. Since the 10-bit data is an example, it may be possible to employ a bit number (for example, 8 bits) smaller than 10 bits or a bit number (for example, 12 bits) exceeding 10 bits.

Figure 4:
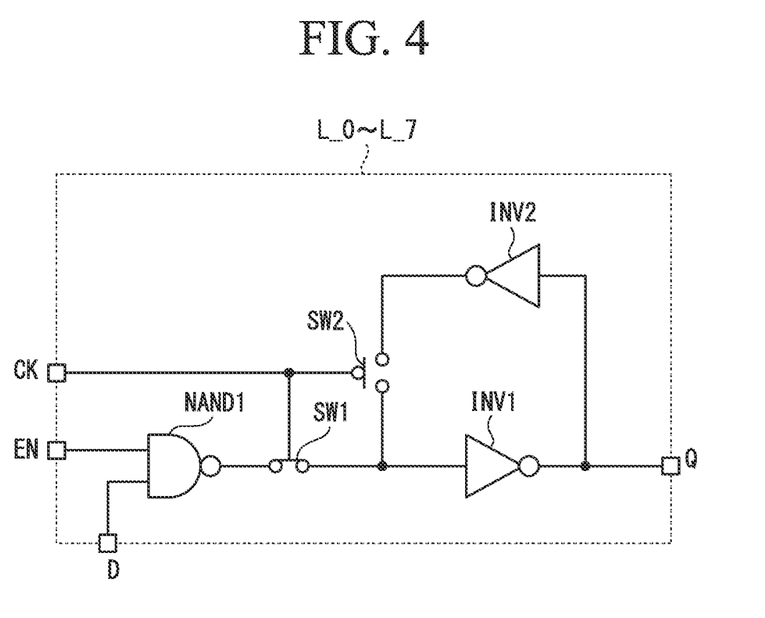
FIG. 4 is a circuit diagram illustrating the configuration of a latch circuit of an A/D conversion circuit included in a solid-state imaging device according to a first embodiment of the present invention.

FIG. 4 illustrates the configuration of the latch circuits L_0 to L_7. The latch circuits L_0 to L_7 include a NAND element NAND1, INV elements (inverter elements) INV1 and INV2, and switches SW1 and SW2.

One input terminal (a second input terminal) of the NAND element NAND1 is connected to an input terminal EN to which the enable signal φEN or the enable signal φEN_7 is input. The other input terminal (a first input terminal) of the NAND element NAND1 is connected to an input terminal D to which one of the output signals φCK0 to φCK7 of the phase shift portion 71 is input.

One terminal of the switch SW1 is connected to an output terminal of the NAND element NAND1. One terminal of the switch SW2 and an input terminal of the INV element INV1 are connected to the other terminal of the switch SW1. The other terminal of the switch SW2 is connected to an output terminal of the INV element INV2. An output terminal of the INV element INV1 and an input terminal of the NV element INV2 are connected to an output terminal Q. A signal output from the output terminal Q constitutes output signals φAD_OUT[0] to φAD_OUT[7].

Control terminals of the switches SW1 and SW2 are connected to an input terminal CK to which the output signal φHOLD of the latch control portion 62 is input, and the switches SW1 and SW2 are controlled by the output signal (MOLD. The switch SW1 is turned ON when the output signal φHOLD is a High state and is turned OFF when the output signal φHOLD is a Low state. The switch SW2 is turned ON when the output signal φHOLD is a Low state and is turned OFF when the output signal φHOLD is a High state.

The NAND element NAND1 outputs a signal obtained by performing a NAND operation on the signals input to the two input terminals. The INV elements INV1 and INV2 output signals obtained by inverting the logic states of the signals input to the input terminals thereof.

The latch circuits L_0 to L_7 are in an enable state when the enable signal φEN or the enable signal φEN_7 input to the input terminal EN is a High state. At this time, the NAND element NAND1 performs an operation for outputting a signal obtained by inverting the logic state of the signal input to the input terminal D. When the latch circuits L_0 to L_7 are in the enable state, if the output signal φHOLD input to the input terminal CK becomes a High state, the switch SW1 is turned ON and the switch SW2 is turned OFF, and thus the latch circuits L_0 to L_7 are in transmission states. At this time, the latch circuits L_0 to L_7 buffer the output signals φCK0 to φCK7 input to the input terminal D, and output the buffered signals from the output terminal Q.

Furthermore, when the latch circuits L_0 to L_7 are in the enable state, if the output signal φHOLD input to the input terminal CK becomes a Low state, the switch SW1 is turned OFF and the switch SW2 is turned ON, and thus the latch circuits L_0 to L_7 are in holding states. At this time, a signal input to the INV element INV1 is output from the INV element INV1, and then is input to the INV element INV2. A signal output from the INV element INV2 is input to the INV element INV1 again. In this way, the latch circuits L_0 to L_7 latch the output signals φCK0 to φCK7 input to the input terminal D. An output signal of the NAND element NAND1 after the latching holds a High state or a Low state.

Furthermore, the latch circuits L_0 to L_7 enter a disable state when the enable signal φEN or the enable signal φEN7 input to the input terminal EN is a Low state. At this time, regardless of the output signal φHOLD input to the input terminal CK, since the output signal of the NAND element NAND1 is locked to a Low state (the NAND element NAND1 stops operating), the latch circuits L_0 to L_7 are not able to latch the output signals φCK0 to φCK7 input to the input terminal D.

Figure 5:
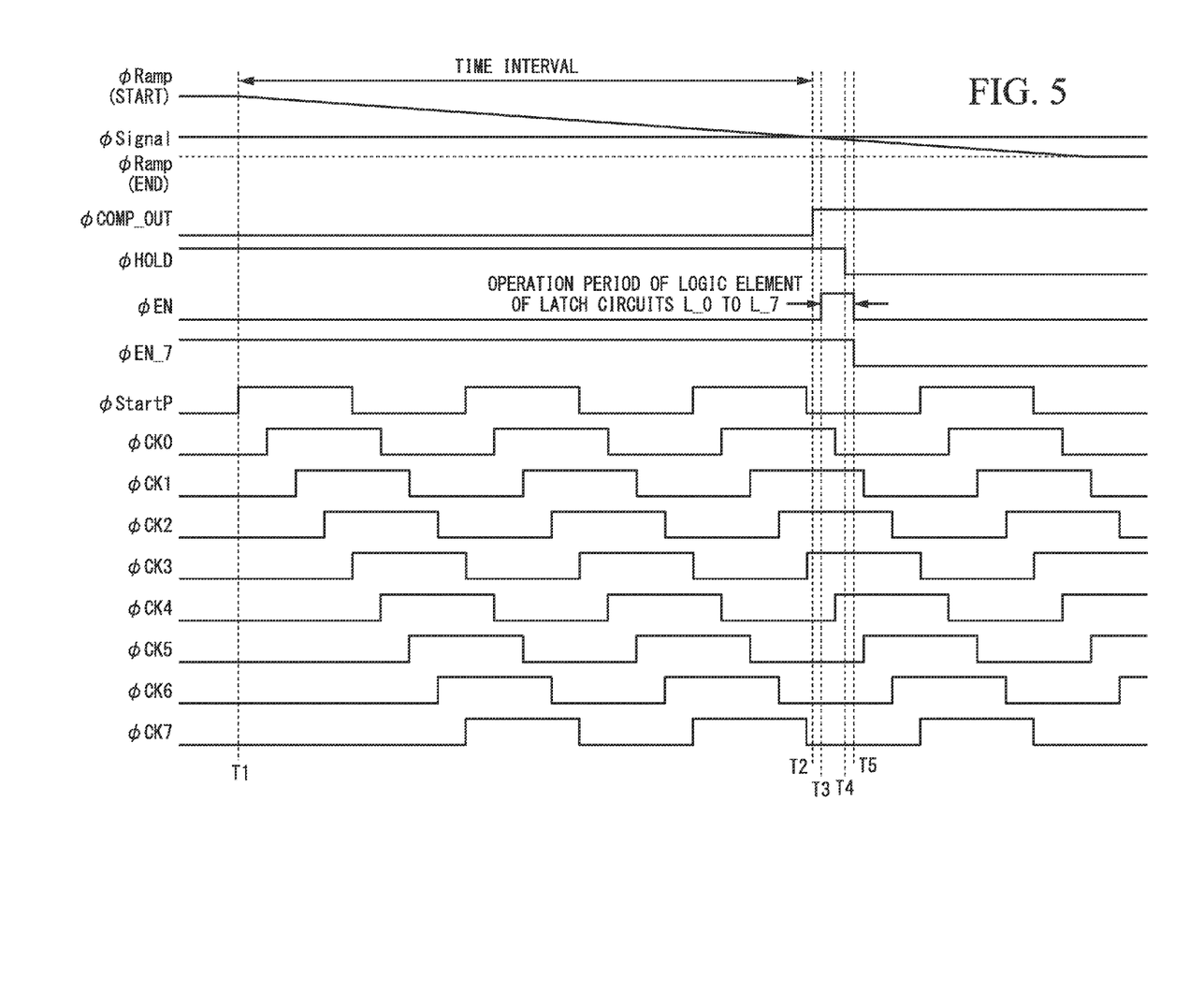
FIG. 5 is a timing chart illustrating the operation of an A/D conversion circuit included in a solid-state imaging device according to a first embodiment of the present invention.

Next, the operation of the A/D conversion circuit 6 according to the present embodiment will be described. Here, a detailed description of an operation of the unit pixel 1 will be omitted. However, as is well known in the art, in the unit pixel 1, a reset level and a signal level are output. The output reset level and signal level are output as the pixel signal φSignal subject to the CDS process in the analog circuit 4. The A/D conversion is performed as follows. FIG. 5 illustrates the operation of the A/D conversion circuit 6 according to the present embodiment.

Firstly, at a timing (a first timing T1) related to the comparison start of the comparison circuit 61, as the start pulse φStartP, a clock of a cycle, which approximately coincides with the delay time of the phase shift portion 71 of the clock generation portion 7, is input. In this way, the phase shift portion 71 starts to operate. The delay unit DU[0] constituting the phase shift portion 71 delays the start pulse φStartP and outputs the output signal φCK0, and the delay units DU[1] to DU[7] constituting the phase shift portion 71 delay output signals of delay units of a previous stage and output the output the delayed output signals as signals φCK1 to φCK7 having different phases from one another.

The output signals φCK0 to φCK7 of the delay units DU[0] to DU[7] are input to the latch circuits L_0 to L_7 of the latch portion 63. The latch circuits L_0 to L_6 are in disable states because the enable signal φEN output from the latch control portion 62 is a Low state, and stops operating. Furthermore, the latch circuit L_7 is in an enable state because the enable signal φEN7 output from the latch control portion 62 is a High state. Consequently, the NAND element NAND1 of the latch circuit L_7 starts to operate. Moreover, since the output signal φHOLD of the latch control portion 62 is a High state, the latch circuit L_7 is in a transmission state, and buffers the output signal φCK7 of the delay unit DU[7] and outputs the buffered output signal.

The counter circuit 64 performs a counting operation based on the output signal φCK7 of the phase shift portion 71 output from the output terminal Q of the latch circuit L_7. In the counting operation, a count value is increased or decreased at the rise or the fall of the output signal φCK7.

After the first timing T1, when the signal voltage according to the ramp wave φRamp is larger than the signal voltage according to the pixel signal φSignal, the output signal φCOMP_OUT of the comparison circuit 61 is a Low state. If the signal voltage according to the ramp wave φRamp becomes equal to or less than the signal voltage according to the pixel signal φSignal, the output signal φCOMP_OUT of the comparison circuit 61 becomes a High state. A period until the output signal φCOMP_OUT of the comparison circuit 61 becomes a High state from the first timing T1 is a time interval to be detected. Within this period, the number of start pulses φStartP which pass through the delay units DU[0] to DU[7] constituting the phase shift portion 71 is a number according to levels of the pixel signal φSignal.

After the time interval to be detected passes from the first timing T1, the output signal φCOMP_OUT of the comparison circuit 61 is inverted (a second timing T2). After a time which coincides with the delay time of the AND element AND1 of the latch control portion 62 lapses from the second timing T2, the enable signal φEN output from the latch control portion 62 becomes a High state, and the latch circuits L_0 to L_6 become enable states (a third timing T3). In this way, the NAND element NAND1 of the latch circuits L_0 to L_6 starts to operate.

After a time which coincides with the delay time of the inversion delay circuit 621 of the latch control portion 62 lapses from the second timing T2, the output signal φHOLD of the inversion delay circuit 621 is inverted and becomes a Low state (a fourth timing T4). In this way, the latch circuits L_0 to L_7 become holding states, and logic states according to the output signals φCK0 to φCK7 of the delay units DU[0] to DU[7] are latched in the latch circuits L_0 to L_7.

After a time which coincides with the delay times of the AND elements AND1 and AND2 lapses from the fourth timing T4, the enable signals φEN and φEN_7 output from the latch control portion 62 become Low states, and the latch circuits L_0 to L_7 become disable states (a fifth timing T5). In this way, the NAND element NAND1 of the latch circuits L_0 to L_7 stops operating.

The counter circuit 64 latches a count value when the latch circuit L_7 becomes a holding state. By the logic state held in the latch portion 63 and the count value held in the counter circuit 64, data corresponding to the time interval is obtained.

Then, digital data latched in the latch circuits L_0 to L_7 and the counter circuit 64 is output from the horizontal scanning circuit 9 through horizontal signal lines, and is transmitted to the encoder circuit 8. The encoder circuit 8 performs a binarization process on the digital data, thereby obtaining binarized data. It may be possible to employ a configuration in which the encoder circuit 8 is embedded in the A/D conversion circuit 6.

In the aforementioned operation, it is possible to reduce power consumption of the latch portion 63 only in the period of time in which the logic element (the NAND element NAND1) of the latch circuits L_0 to L_6 operates from the third timing T3 to the fifth timing T5. Consequently, according to the present embodiment, it is possible to achieve a solid-state imaging device with reduced power consumption.

Moreover, in the present embodiment, the output signals φCK0 to φCK7 of the delay units DU[0] to DU[7] of the phase shift portion 71 are input to one input terminal of the NAND element NAND1 constituting the latch circuits L_0 to L_7, respectively. Furthermore, signal lines for transmitting the output signals φCK0 to φCK7 of the delay units DU[0] to DU[7] are separated from a circuit of a next stage by the NAND element NAND1.

Thus, regardless of the states of the latch circuits L_0 to L_7, load capacities of the signal lines for transmitting the output signals φCK0 to φCK7 of the delay units DU[0] to DU[7] are approximately equal to one another. Consequently, at the first timing T1 to the third timing T3, even when the latch circuits L_0 to L_6 are in disable states and the latch circuit L_7 is in enable states, a phase relation of the output signals φCK0 to φCK7 of the delay units DU[0] to DU[7] is maintained. Furthermore, after the third timing T3, the latch circuits L_0 to L_7 are in the same state, and the phase relation of the output signals φCK0 to φCK7 of the delay units DU[0] to DU[7] is maintained similarly to the first timing T1 to the third timing T3.

In the present embodiment, the signal level of the pixel signal subject to the CDS process in an analog manner is A/D converted, so that the solid-state imaging device operates to obtain digital data according to the pixel signal. However, the operation of the solid-state imaging device is not limited thereto. For example, at the time of a first read operation, the solid-state imaging device may read a reset level including noise of the pixel signal from the unit pixel 1 and perform A/D conversion. Next, at the time of a second read operation, the solid-state imaging device may read a signal level from the unit pixel 1 and perform A/D conversion. Then, the solid-state imaging device may perform a CDS operation in a digital manner, thereby obtaining digital data according to the pixel signal. Furthermore, the present invention is not limited thereto.

The configuration of the latch circuits L_0 to L_7 of the A/D conversion circuit 6 is not limited to the configuration of FIG. 4, and includes a 2-input logic element (for example, a NAND element or a NOR element). It is sufficient if the output signal of the delay unit is input to one input terminal of the logic element, and the enable signal is input to the other input terminal.

Second Embodiment

Figure 6:
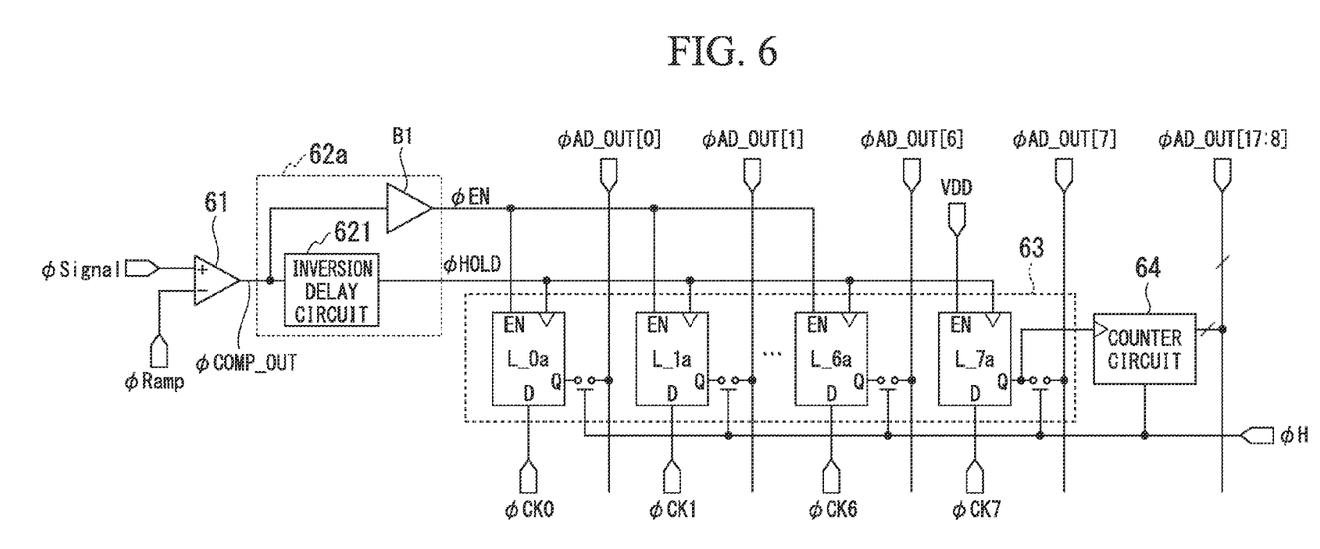
FIG. 6 is a block diagram illustrating the configuration of an A/D conversion circuit included in a solid-state imaging device according to a second embodiment of the present invention.

Next, a second embodiment of the present invention will be described. FIG. 6 illustrates the configuration of the A/D conversion circuit 6 according to the present embodiment. Since the configuration of a solid-state imaging device according to the present embodiment is substantially the same as that of the first embodiment except for the configuration of the A/D conversion circuit 6, a description thereof will be omitted.

The A/D conversion circuit 6 according to the present embodiment includes a latch control portion 62a instead of the latch control portion 62 in the first embodiment, and includes latch circuits L_0a to L_7a instead of the latch circuits L_0 to L_7 in the first embodiment. The latch control portion 62a includes the inversion delay circuit 621 and a buffer element B1, and generates control signals (φEN and φHOLD) for controlling the latch portion 63 based on the output signal φCOMP_OUT of the comparison circuit 61. An input terminal of the buffer element B1 is connected to the output terminal of the comparison circuit 61, and the buffer element B1 buffers a signal input to an input terminal thereof and outputs the buffered signal.

The latch portion 63 includes the latch circuits L_0a to L_7a. The latch circuits L_0a to L_7a latch (hold/store) logic states of signals which are input to input terminals D thereof at a timing at which an output signal φHOLD of the latch control portion 62a is inverted.

Figure 7:
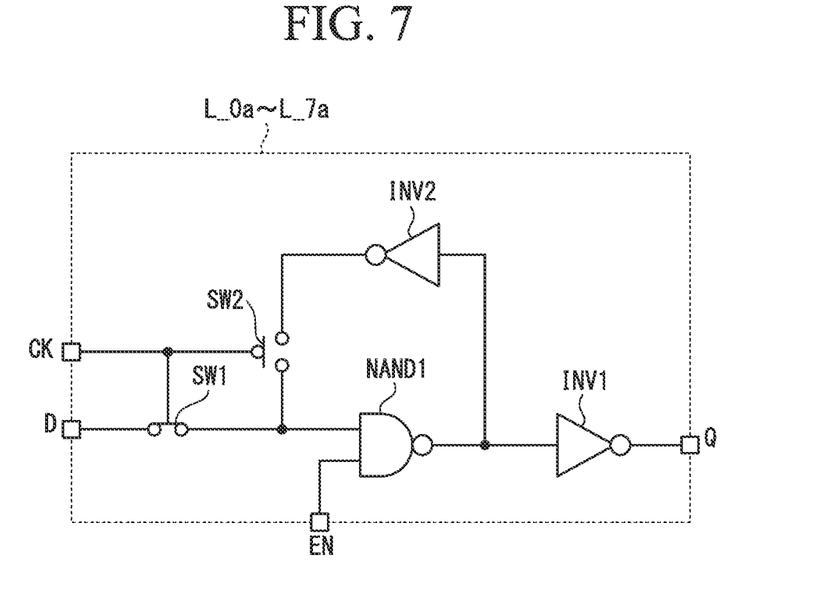
FIG. 7 is a circuit diagram illustrating the configuration of a latch circuit of an A/D conversion circuit included in a solid-state imaging device according to a second embodiment of the present invention.

FIG. 7 illustrates the configuration of the latch circuits L_0a to L_7a. The latch circuits L_0a to L_7a include a NAND element NAND1, INV elements (inverter elements) INV1 and INV2, and switches SW1 and SW2.

One terminal of the switch SW1 is connected to an input terminal D to which one of the output signals φCK0 to φCK7 of the phase shift portion 71 is input. One terminal of the switch SW2 and one input terminal (a first input terminal) of the NAND element NAND1 are connected to the other terminal of the switch SW1. The other terminal of the switch SW2 is connected to an output terminal of the INV element INV2. The other input terminal (a second input terminal) of the NAND element NAND1 is connected to an input terminal EN to which the enable signal φEN is input.

An input terminal of the INV element INV1 and an input terminal of the INV element INV2 are connected to an output terminal of the NAND element NAND1. An output terminal of the INV element INV1 is connected to an output terminal Q. A signal output from the output terminal Q constitutes output signals φAD_OUT[0] to φAD_OUT[7].

Control terminals of the switches SW1 and SW2 are connected to an input terminal CK to which the output signal φHOLD of the latch control portion 62a is input, and the switches SW1 and SW2 are controlled by the output signal φHOLD. The switch SW1 is turned ON when the output signal φHOLD is a High state and is turned OFF when the output signal φHOLD is a Low state. The switch SW2 is turned ON when the output signal φHOLD is a Low state and is turned OFF when the output signal φHOLD is a High state.

The NAND element NAND1 outputs a signal obtained by performing a NAND operation on the signals input to the two input terminals. The INV elements INV1 and INV2 output signals obtained by inverting the logic states of the signals input to the input terminals thereof.

The latch circuits L_0a to L_7a are in an enable state when the enable signal φEN input to the input terminal EN is a High state. At this time, the NAND element NAND1 performs an operation for outputting a signal obtained by inverting the logic state of the signal input to the input terminal D. When the latch circuits L_0a to L_7a are in the enable state, if the output signal φHOLD input to the input terminal CK becomes a High state, the switch SW1 is turned ON and the switch SW2 is turned OFF, and thus the latch circuits L_0a to L_7a are transmission states. At this time, the latch circuits L_0a to L_7a buffer the output signals φCK0 to φCK7 input to the input terminal D, and output the buffered signals from the output terminal Q.

Furthermore, when the latch circuits L_0a to L_7a are in the enable state, if the output signal φHOLD input to the input terminal CK becomes a Low state, the switch SW1 is turned OFF and the switch SW2 is turned ON, and thus the latch circuits L_0a to L_7a is a holding state. At this time, a signal input to the NAND element NAND1 is output from the NAND element NAND1, and then is input to the INV element INV2. A signal output from the INV element INV2 is input to the NAND element NAND1 again. In this way, the latch circuits L_0a to L_7a latch the output signals φCK0 to φCK7 input to the input terminal D. An output signal of the NAND element NAND1 after the latching holds a High state or a Low state.

Furthermore, the latch circuits L_0a to L_7a are in a disable state when the enable signal φEN input to the input terminal EN is a Low state. At this time, regardless of the output signal φHOLD input to the input terminal CK, since the output signal of the NAND element NAND1 is locked to a Low state (the NAND element NAND1 stops operating), the latch circuits L_0a to L_7a are not able to latch the output signals φCK0 to φCK7 input to the input terminal D. In the present embodiment, the input terminal EN of the latch circuit L_7a is connected to a power supply voltage VDD and the latch circuit L_7a is always in the enable state.

Figure 8:
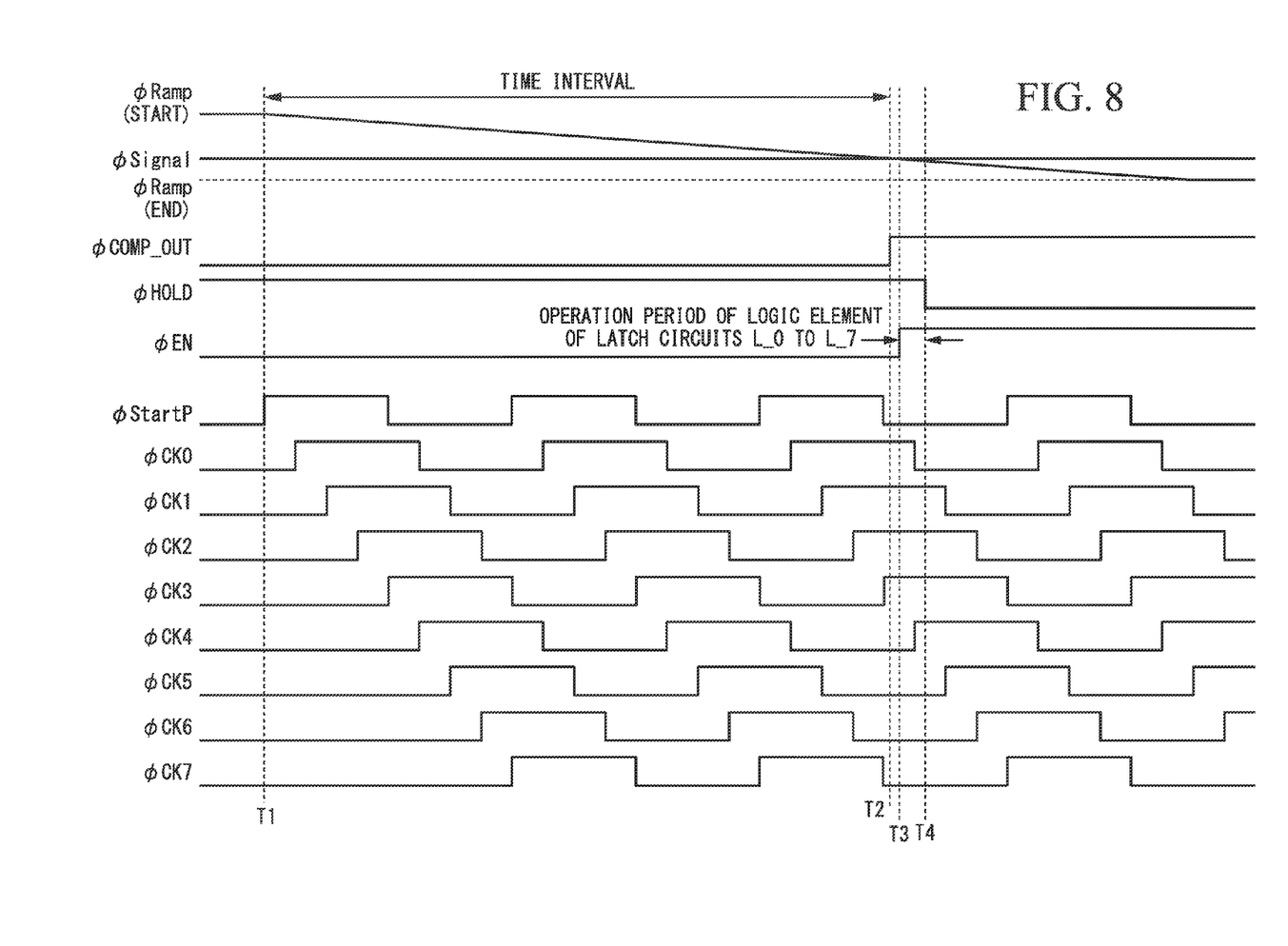
FIG. 8 is a timing chart illustrating the operation of an A/D conversion circuit included in a solid-state imaging device according to a second embodiment of the present invention.

Next, the operation of the A/D conversion circuit 6 according to the present embodiment will be described. Since operations other than the operation of the A/D conversion circuit 6 are the same as those in the first embodiment, a description thereof will be omitted. FIG. 8 illustrates the operation of the A/D conversion circuit 6 according to the present embodiment.

Firstly, at a timing (a first timing T1) related to the comparison start of the comparison circuit 61, as the start pulse φStartP, a clock of a cycle which approximately coincides with the delay time of the phase shift portion 71 of the clock generation portion 7 is input. In this way, the phase shift portion 71 starts to operate. The delay unit DU[0] constituting the phase shift portion 71 delays the start pulse φStartP and outputs the output signal φCK0. The delay units DU[1] to DU[7] constituting the phase shift portion 71 delay output signals of delay units of a previous stage and output the output signals φCK1 to φCK7 having different phases from one another.

The output signals φCK0 to φCK7 of the delay units DU[0] to DU[7] are input to the latch circuits L_0a to L_7a of the latch portion 63. The latch circuits L_0a to L_6a are in a disable state because the enable signal φEN output from the latch control portion 62a is a Low state, and stop operating. Furthermore, the latch circuit L_7a is in an enable state because the input terminal EN is connected to the power supply voltage VDD. Consequently, the NAND element NAND1 of the latch circuit L_7a starts to operate. Moreover, since the output signal φHOLD of the latch control portion 62a is a High state, the latch circuit L_7a is in a transmission state, and buffers and outputs the output signal φCK7 of the delay unit DU[7].

The counter circuit 64 performs a counting operation based on the output signal φCK7 of the phase shift portion 71 output from the output terminal Q of the latch circuit L_7a. In the counting operation, a count value is increased or decreased at the rise or the fall of the output signal φCK7.

After the first timing T1, when the signal voltage according to the ramp wave φRamp is larger than the signal voltage according to the pixel signal φSignal, the output signal φCOMP_OUT of the comparison circuit 61 is a Low state. If the signal voltage according to the ramp wave φRamp is equal to or less than the signal voltage according to the pixel signal φSignal, the output signal φCOMP_OUT of the comparison circuit 61 becomes a High state. A period until the output signal φCOMP_OUT of the comparison circuit 61 becomes a High state from the first timing T1 is a time interval to be detected. Within this period, the number of start pulses φStartP which pass through the delay units DU[0] to DU[7] constituting the phase shift portion 71 is a number according to levels of the pixel signal φSignal.

After the time interval to be detected passes from the first timing T1, the output signal φCOMP_OUT of the comparison circuit 61 is inverted (a second timing T2). After a time which coincides with the delay time of the buffer element B1 of the latch control portion 62a lapses from the second timing T2, the enable signal φEN output from the latch control portion 62a becomes a High state, and the latch circuits L_0a to L_6a enter an enable state (a third timing T3). In this way, the NAND element NAND1 of the latch circuits L_0a to L_6a starts to operate.

After a time which coincides with the delay time of the inversion delay circuit 621 of the latch control portion 62a lapses from the second timing T2, the output signal φHOLD of the inversion delay circuit 621 is inverted and becomes a Low state (a fourth timing T4). In this way, the latch circuits L_0a to L_7a enter a holding state, and logic states according to the output signals φCK0 to φCK7 of the delay units DU[0] to DU[7] are latched in the latch circuits L_0a to L_7a.

The counter circuit 64 latches a count value when the latch circuit L_7a becomes a holding state. From the logic state held in the latch portion 63 and the count value held in the counter circuit 64, data corresponding to the time interval is obtained.

Then, digital data latched in the latch circuits L_0a to L_7a and the counter circuit 64 is output from the horizontal scanning circuit 9 through horizontal signal lines, and is transmitted to the encoder circuit 8. The encoder circuit 8 performs a binarization process on the digital data, thereby obtaining binarized data. It may be possible to employ a configuration in which the encoder circuit 8 is embedded in the A/D conversion circuit 6.

In the aforementioned operation, it is possible to reduce power consumption of the latch portion 63 only in the period of time in which the logic element (the NAND element NAND1) of the latch circuits L_0a to L_6a operates after the third timing T3. Consequently, according to the present embodiment, it is possible to achieve a solid-state imaging device with reduced power consumption.

Moreover, in the present embodiment, the output signals φCK0 to φCK7 of the delay units DU[0] to DU[7] of the phase shift portion 71 are input to one input terminal of the NAND element NAND1 constituting the latch circuits L_0a to L_7a, respectively. Furthermore, signal lines for transmitting the output signals φCK0 to φCK7 of the delay units DU[0] to DU[7] are separated from a circuit of a next stage by the NAND element NAND1 and the INV element INV2. Thus, regardless of the states of the latch circuits L_0a to L_7a, load capacities of the signal lines for transmitting the output signals φCK0 to φCK7 of the delay units DU[0] to DU[7] are approximately equal to one another. Consequently, at the first timing T1 to the third timing T3, even when the latch circuits L_0a to L_6a are in a disable state and the latch circuit L_7a is in an enable state, a phase relation of the output signals φCK0 to φCK7 of the delay units DU[0] to DU[7] is maintained. Furthermore, after the third timing T3, the latch circuits L_0a to L_7a are in the same state, and the phase relation of the output signals φCK0 to φCK7 of the delay units DU[0] to DU[7] is maintained similarly to the first timing T1 to the third timing T3.

In the present embodiment, the signal level of the pixel signal subject to the CDS process in an analog manner is A/D converted, so that the solid-state imaging device operates to obtain digital data according to the pixel signal. However, the operation of the solid-state imaging device is not limited thereto. For example, at the time of a first read operation, the solid-state imaging device may read a reset level including noise of the pixel signal from the unit pixel 1 and perform A/D conversion. Next, at the time of a second read operation, the solid-state imaging device may read a signal level from the unit pixel 1 and perform A/D conversion. Then, the solid-state imaging device may perform a CDS operation in a digital manner, thereby obtaining digital data according to the pixel signal. Furthermore, the present invention is not limited thereto.

The configuration of the latch circuits L_0a to L_7a of the A/D conversion circuit 6 is not limited to the configuration of FIG. 7, and includes a 2-input logic element (for example, a NAND element or a NOR element). It is sufficient if the output signal of the delay unit is input to one input terminal of the logic element, and the enable signal is input to the other input terminal.

So far, embodiments of the present invention have been described in detail with reference to the accompanying drawings. However, detailed configurations are not limited to the aforementioned configurations. For example, various design modifications can be made without departing from the scope of the present invention. For example, in FIG. 1, the A/D conversion circuit 6 is arranged corresponding to one column of the unit pixel 1 in the pixel array 2. However, the A/D conversion circuit 6 may be arranged for a plurality of columns and one A/D conversion circuit 6 may be shared by the plurality of columns. So far, the embodiments of the present invention have been described. However, the present invention is not limited to the embodiments. The present invention may be subject to addition, omission, replacement, and other modifications of the configuration in a range not departing from the spirit of the present invention. The present invention is not limited to the above-mentioned description but is limited only by the accompanying claims.

What is claimed is:

1. An A/D conversion circuit comprising:
a reference signal generation portion that generates a reference signal that increases or decreases with lapse of time from a predetermined start timing;
a comparison portion that compares an analog signal with the reference signal, and outputs a comparison signal at an end timing at which the reference signal satisfies a predetermined condition with respect to the analog signal;
a delay portion that outputs the comparison signal that is delayed;
a phase shift portion that outputs a plurality of clock signals having different phases from one another in response to a time change from the start timing;
a latch portion including a plurality of latch units, each of the plurality of latch units latching a corresponding one of the plurality of clock signals at a timing when the comparison signal is outputted from the delay portion;
a count portion wherein, any one of the plurality of latch units being defined as a count latch unit and the latch units other than the count latch unit being defined as non-count latch units, the count portion counts a clock signal that is latched by the count latch unit; and
an operation portion that generates a digital signal according to a signal held in the latch portion,
wherein each of the plurality of latch units includes a first logic element having a first input terminal and a second input terminal,
wherein the first input terminal of the first logic element receives the corresponding one of the plurality of clock signals,
wherein the second input terminal of the first logic element receives an enable signal,
wherein each of the plurality of latch units does not latch the corresponding one of the plurality of clock signals when the enable signal is not received,
wherein a second logic element outputs the enable signal at an end timing that is based on the comparison signal;
wherein a third logic element outputs the enable signal before the end timing that is based on the comparison signal;
wherein the second input terminal of the first logic element of the count latch unit receives the enable signal that is outputted from the third logic element,
wherein the second input terminal of the first logic element of the non-count latch unit receives the enable signal that is outputted from the second logic element, and
wherein the count latch unit and the non-count latch unit receives output of the delay portion.

2. The A/D conversion circuit according to claim 1, wherein each of the plurality of latch units that is connected to the first logic element and further comprises a delay element that delays a signal output from the first logic element, and
wherein, after the predetermined time lapses from the end timing based on the comparison signal, a signal output from the delay element is looped and input to the delay element, so that a latch operation is performed.

3. The A/D conversion circuit according to claim 1, wherein each of the plurality of latch units that is connected to the first logic element and further comprises a delay element that delays a signal output from the first logic element, and
wherein, after the predetermined time lapses from the end timing based on the comparison signal, a signal output from the delay element is looped and input to the first input terminal of the first logic element, so that a latch operation is performed.

4. The A/D conversion circuit according to claim 1, wherein the phase shift portion comprises a plurality of delay units that delay and output an input signal and is a ring-like delay circuit in which the plurality of delay units are connected to one another in a ring shape.

5. A solid-state imaging device comprising:
an imaging portion in which a plurality of pixels are arranged in a matrix form to output a pixel signal in response to an amplitude of an incident electromagnetic wave; and
the A/D conversion circuit according to claim 1, which receives the analog signal according to the pixel signal,
wherein the comparison portion and the latch portion are provided for one column or a plurality of columns of the pixels constituting the imaging portion.

6. The A/D conversion circuit according to claim 1, wherein the second logic element receives the comparison signal before delaying at the delay portion and the comparison signal outputted from the delay portion, and outputs the enable signal, and
wherein the third logic element receives the comparison signal outputted from the delay portion, and outputs the enable signal.

* * * * *